(12) United States Patent
Chuang

(10) Patent No.: US 6,733,621 B2
(45) Date of Patent: May 11, 2004

(54) VENTING APPARATUS AND METHOD FOR VACUUM SYSTEM

(75) Inventor: Jeng-Chiang Chuang, Kaohsiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 108 days.

(21) Appl. No.: 10/141,544

(22) Filed: May 8, 2002

(65) Prior Publication Data

US 2003/0209513 A1 Nov. 13, 2003

(51) Int. Cl.[7] .......... H01L 21/306; C23F 1/00; C23C 16/00
(52) U.S. Cl. .......... 156/345.29; 118/715; 204/298.07; 204/298.33
(58) Field of Search .......... 156/345.29; 204/298.07, 204/298.33; 118/715

(56) References Cited

U.S. PATENT DOCUMENTS

| | | | | |
|---|---|---|---|---|
| 4,761,269 A | * | 8/1988 | Conger et al. | 118/679 |
| 5,458,086 A | * | 10/1995 | Smith et al. | 117/200 |
| 5,458,689 A | * | 10/1995 | Saito | 118/724 |
| 5,730,804 A | * | 3/1998 | Gomi et al. | 118/726 |
| 5,769,950 A | * | 6/1998 | Takasu et al. | 118/715 |
| 5,888,579 A | * | 3/1999 | Lun | 427/8 |
| RE36,295 E | * | 9/1999 | Smith et al. | 117/200 |
| 5,950,675 A | * | 9/1999 | Minami et al. | 137/606 |
| 5,954,911 A | * | 9/1999 | Bergman et al. | 156/345.29 |
| 6,106,626 A | * | 8/2000 | Guan et al. | 118/715 |
| 6,165,272 A | * | 12/2000 | Liu | 118/715 |
| 6,270,581 B1 | * | 8/2001 | Inokuchi et al. | 118/696 |
| 2003/0209513 A1 | * | 11/2003 | Chuang | 216/2 |

FOREIGN PATENT DOCUMENTS

JP 01-287277 * 11/1989

* cited by examiner

Primary Examiner—Jeffrie R. Lund
(74) Attorney, Agent, or Firm—Tung & Associates

(57) ABSTRACT

A method and apparatus comprising a purge conduit and vent conduit attached to a turbo pump of a plasma etch chamber. The purge conduit may communicate with atmospheric air or with a nitrogen source or clean, dry air (CDA) source, and the vent conduit is fitted with a manual valve, an electric valve, or both, along with a flow restrictor and an end cap provided with an air or gas vent. The air flow restrictor facilitates gradual, rather than rapid, escape of air or gas from the chamber, through the turbo pump and from the vent conduit upon opening a gate valve between the chamber and the turbo, to prevent damage to the internal turbo pump components.

16 Claims, 1 Drawing Sheet

VENTING APPARATUS AND METHOD FOR VACUUM SYSTEM

FIELD OF THE INVENTION

The present invention relates to an apparatus and method for venting pressure from closed systems. More particularly, the invention relates to an apparatus and method for venting vacuum pressure from a semiconductor wafer etcher in order to prevent damage to a turbo pump in the etcher.

BACKGROUND OF THE INVENTION

In the fabrication of semiconductor devices, particularly sub-micron scale semiconductor devices, profiles obtained in the etching process are very important. Careful control of a surface etch process is therefore necessary to ensure directional etching. In conducting an etching process, when an etch rate is considerably higher in one direction than in the other directions, the process is called anisotropic. A reactive ion etching (RIE) process assisted by plasma is frequently used in an anisotropic etching of various material layers on top of semiconductor substrate. In plasma enhanced etching processes, the etch rate of a semiconductor material is frequently larger than the sum of the individual etch rates for ion sputtering and individual etching due to a synergy in which chemical etching is enhanced by ion bombardment.

To avoid subjecting a semiconductor wafer to high-energy ion bombardment, the wafer may also be placed downstream from the plasma and outside the discharge area. Downstream plasma etches more in an isotropic manner since there are no ions to induce directional etching. The downstream reactors are frequently used for removing resist or other layers of material where patterning is not critical. In a downstream reactor, radio frequency may be used to generate long-lived radioactive species for transporting to a wafer surface located remote from the plasma. Temperature control problems and radiation damage are therefore significantly reduced in a downstream reactor. Furthermore, the wafer holder can be heated to a precise temperature to increase the chemical reaction rate, independent of the plasma.

In a downstream reactor, an electrostatic wafer holding device known as an electrostatic chuck is frequently used. The electrostatic chuck attracts and holds a wafer positioned on top electrostatically. The electrostatic chuck method for holding a wafer is highly desirable in the vacuum handling and processing of wafers. An electrostatic chuck device can hold and move wafers with a force equivalent to several tens of Torr pressure, in contrast to a conventional method of holding wafers by a mechanical clamping method.

Referring initially to FIG. 1, a conventional inductively coupled plasma etched chamber 10 is shown. In the etch chamber 10, which typically represents one that is commercially available as a LAM TCP etcher, the plasma source is a transformer-coupled source that generates a high density, low pressure plasma away from a wafer surface. The plasma source allows an independent control of ion flux and ion energy. The plasma can be generated by a flat spiral coil (not shown), i.e., an inductive coil separated from the plasma by a dielectric plate 12 which is normally fabricated of a ceramic material with a gas inlet 14 provided therein. The dielectric plate 12 may be a dielectric window made of a substantially transparent material such as quartz to facilitate visual observation of a middle chamber 20. The middle chamber 20 is further formed by a bottom ceramic plate 16 equipped with an opening 18 for allowing a plasma to pass thereto. The sidewall 22 of the middle chamber 20 is normally formed of a metallic material, such as aluminum, with an anodized aluminum surface. The top ceramic plate 12, the bottom ceramic plate 16 and the metallic sidewall 22 form a self-contained chamber, i.e., the middle chamber 20 which has a first cavity 24 therein.

A wafer 30 is positioned on an electrostatic chuck (or ESC) 26, inside the chamber interior 33 of the main chamber 32, sufficiently away from the RF coil (not shown) such that it is not affected by the electromagnetic field generated by the RF coil. A typical LAM TCP plasma etcher enables a high density plasma to be produced and a high etch rate to be achieved. In a typical inductively coupled RF plasma etcher 10, an inductive supply and a bias supply are further used to generate the necessary plasma field. In a typical inductively coupled RF plasma etcher 10, shown in FIG. 1, a source frequency of 13.5 MHZ and a substrate bias frequency of 13.5 MHZ are utilized such that ion density of about $0.5$–$2.0 \times 10^2$ cm$^3$ is obtained at the wafer level, while electron temperature of about 3.5–6.0 eV and a chamber pressure of 1–25 mTorr are achieved.

In the plasma chamber 10, after the wafer 30 is etched in a main chamber 32, etchant gas is normally evacuated from the middle chamber 20 and from the main chamber 32 by a turbo pump 34 controlled by a gate valve 36. The turbo pump 34 is further connected to a dry pump 38 through an isolation valve 42 and connecting conduits 40 and 44. Opening of the isolation valve 42 allows the etchant gas to be evacuated from the turbo pump 34 by the dry pump 38. Simultaneous with the etchant gas pumping process, an inert purge gas such as nitrogen is introduced into the middle chamber 20 and the main chamber 32 through the gas inlet 14 to further facilitate the removal of residual etchant gas from the chamber interiors 24 and 33, respectively.

In the conventional plasma chamber 10, over time etchant gas flowing through the main chamber 32, the middle chamber 20 and the gate valve 36 frequently causes corrosion of the internal components of these elements. Accordingly, the internal components of the main chamber 32, the middle chamber 20 and the gate valve 36 must periodically be cleaned and repaired for routine maintainence of the plasma etch chamber 10. This is accomplished by initially closing the gate valve 36 in order to vent residual etchant gas from the plasma etch chamber 10 typically by operation of a chamber auto-vent 28, manually opened and closed by a lever 29. This action causes atmospheric or ambient air to enter the chamber interior 24 of the middle chamber 20 and the chamber interior 33 of the main chamber 32, and the air pressure in the chamber interiors 24, 33 equalizes with the atmospheric or ambient air. Simultaneously, the turbo pump 34 generates an internal vacuum pressure which is isolated by the closed gate valve 36 and the isolation valve 42. After maintenance of the main chamber 32, the middle chamber 20 and/or the gate valve 36, the gate valve 36 is manually re-opened to equalize pressure between the middle chamber 20 and the turbo pump 34. Due to the relatively large difference in pressure between the chamber interiors 24, 33 and the internal vacuum generated by the turbo pump 34, typically about 760 Torr, air contained in the chamber interiors 24, 33 rushes through the now-open gate valve 36 and into the turbo pump 34, which is prone to damage due to the rushing air. Therefore, an apparatus is needed for equalizing pressure between the chamber interior 24 of the middle chamber 20 and the turbo pump 34 prior to opening the gate valve 36 in order to prevent damage to the turbo pump 34.

SUMMARY OF THE INVENTION

Accordingly, an object of the present invention is to provide an apparatus and method for preventing vacuuminduced damage to a turbo pump in a plasma etch chamber or system for semiconductors.

Another object of the present invention is to provide an apparatus and method for venting pressure from a closed system.

Another object of the present invention is to provide an apparatus and method for dispelling or reducing pressure differentials in a system.

Still another object of the present invention is to provide an apparatus and method for reducing a pressure differential between a chamber and a pump separated from the chamber by a valve before opening the valve.

Yet another object of the present invention is to provide an apparatus and method for gradually dispelling vacuum pressure from a closed system in order to prevent damage to internal components of the system.

Still another object of the present invention is to provide an apparatus and method for raising pressure in a turbo pump from a vacuum pressure to atmospheric or near-atmospheric pressures before opening a gate valve between the turbo pump and a chamber in order to equalize or nearly equalize pressure between the air or gas pressure in the turbo pump and the air or gas pressure in the chamber and prevent damage to the turbo pump.

A still further object of the present invention is to provide a venting apparatus which can be retrofitted to a variety of closed vacuum systems including but not limited to plasma etch systems having a turbo pump, a gate valve and an isolation valve.

Yet another object of the present invention is to provide a plasma etch chamber which includes a venting apparatus for selectively venting vacuum pressure from the chamber.

In accordance with these and other objects and advantages, the present invention includes a method and apparatus comprising a purge conduit and vent conduit attached to a turbo pump of a plasma etch chamber. The purge conduit may communicate with atmospheric air or with a nitrogen source or clean, dry air (CDA) source, and the vent conduit is fitted with a manual valve, an electric valve, or both, along with a flow restrictor and an end cap provided with an air or gas vent. The air flow restrictor facilitates gradual, rather than rapid, escape of air or gas from the chamber, through the turbo pump and from the vent conduit upon opening a gate valve between the chamber and the turbo, to prevent damage to the internal turbo pump components.

BRIEF DESCRIPTION OF THE DRAWINGS

The invention will now be described, by way of example, with reference to the accompanying drawings, wherein.

DESCRIPTION OF THE PREFERRED EMBODIMENTS

The present invention has particularly beneficial utility in dispelling vacuum pressure from turbo pumps used in conjunction with plasma etch chambers in the semiconductor fabrication industry. However, the invention is not so limited in application, and while references may be made to such plasma etch chambers, the invention is generally applicable to dispelling vacuum pressure from closed systems in a variety of industrial and mechanical applications.

In a typical etching process for a metallization layer on an IC device, such as, for instance, a metallization layer formed of aluminum or aluminum alloys with copper, tungsten, etc., an etchant gas of $Cl_2$ or $BCl_3$, and typically, a mixture of $Cl_2$ and $BCl_3$, is used. The mix ratio of the etchant gases can be suitably controlled by their individual flow rates into the etch chamber. For instance, for etching aluminum, a suitable mix ratio of $Cl_2$ and $BCl_3$ may be between 0.5:1 and 4:1. A suitable flow rate for the gases is usually between 100 Sccm and 500 Sccm, which presents a chamber pressure of between 5 mTorr and 25 mTorr. For certain applications in etching metallization layers, i.e., specifically in the etching of via or contact holes, another etchant gas of polymeric nature such as $CHF_3$ or $CF_4$ may also be used such that sidewall passivation may be formed of the polymeric material to further enhance anisotropic etch effect, i.e., a more vertical aluminum sidewall after etching can be obtained. A preferred mix ratio of $Cl_2$ and $BCl_3$ is between 2:1 and 4:1.

Figure 2:
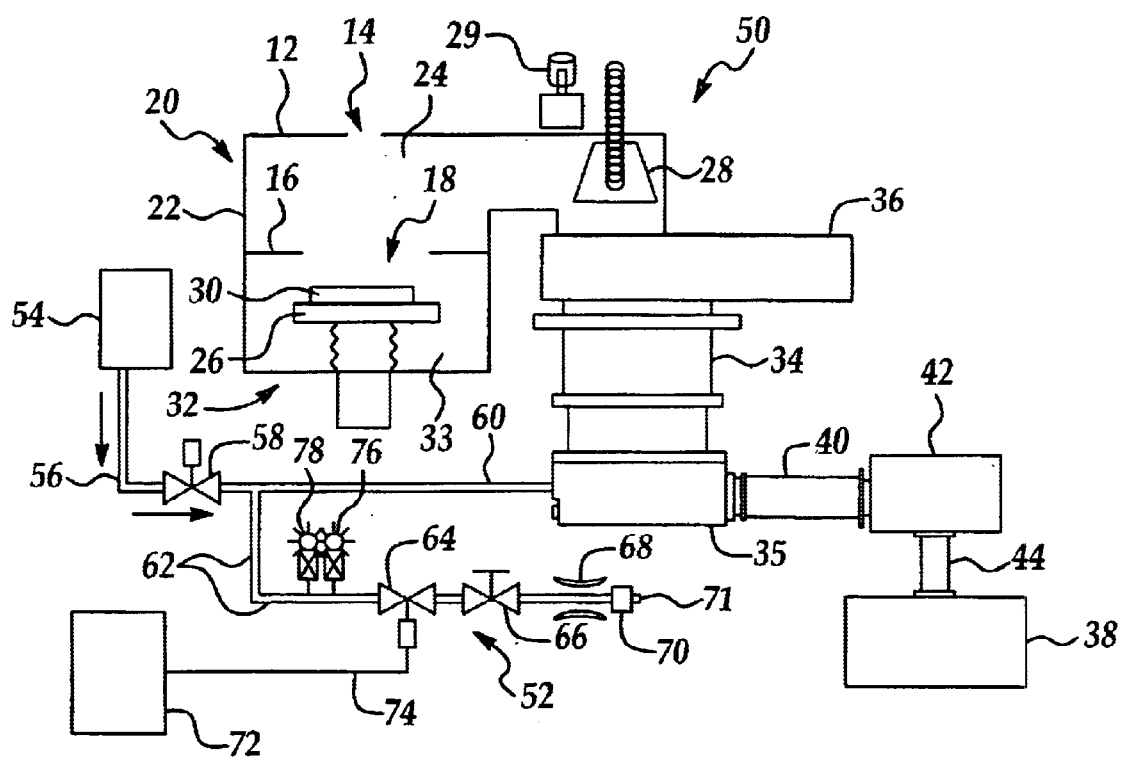
FIG. 2 is a schematic view of a venting apparatus of the present invention, provided on a plasma etch chamber or system.

In the high plasma density reactor of the transformer-coupled type, shown in the schematic of FIG. 2, a desirable aluminum etch rate can be obtained by suitably adjusting the mix ratio of $Cl_2$ and $BCl_3$. For instance, when an eight inch wafer is positioned on an electrostatic chuck for conducting an etching process, a mix ratio of 4:1 of $Cl_2$ and $BCl_3$ can be suitably used to achieve a total flow rate of 300 Sccm and a chamber pressure of about 20 mTorr. Under such etch conditions, a desirable etch rate between 10,000 Å/min and 13,000 Å/min can be achieved.

Referring next to FIG. 2, a plasma etch chamber with venting apparatus of the present invention is generally indicated by reference numeral 50. The plasma etch chamber 50 includes a middle chamber 20 having a chamber interior 24 which communicates with the chamber interior 33 of a main chamber 32 through an opening 18. An electrostatic chuck 26 is provided in the chamber interior 33 of the main chamber 32 for holding a semiconductor wafer 30 thereon. The middle chamber 20 is constructed by a top ceramic plate 12, a bottom ceramic plate 16 and a metal sidewall 22. A gas inlet 14 is provided at a center of the top ceramic plate 12 for introducing either an etchant gas mixture or an inert purge gas into the chamber interior 24. A shower head (not illustrated) provided at the center of the bottom ceramic plate 16 includes small diameter openings for dispersing an etchant gas plasma into the chamber interior 33 of the main chamber 32. The plasma source is typically a transformer-coupled source that generates a high density, low pressure plasma away from the surface of the wafer 30. The plasma source typically allows independent control of ion flux and ion energy. The plasma can be generated by a flat spiral coil (not shown), i.e., an inductive coil separated from the plasma by the dielectric top ceramic plate 12, or by other mechanisms known by those skilled in the art.

The chamber interior 24 of the middle chamber 20 communicates with a turbo pump 34 through a gate valve 36. Typically, a high flow rate turbo pump 34 is used for providing high flow rates at very low chamber pressures. For instance, in one configuration, the turbo pump 34 is capable of pumping about 50 Sccm at a low pressure of about 1 mTorr, and at a substantially higher rate such as 300 Sccm at a higher pressure of about 4 mTorr. When the chamber pressure is significantly higher, i.e., higher than 200 mTorr, the turbo pump cannot be used for danger of damage to the turbo pump 34. An isolation valve 42 is connected to the output 35 of the turbo pump 34 through a conduit 40, and a dry pump 38 is connected to the isolation valve 42 through a conduit 44.

Figure 1:
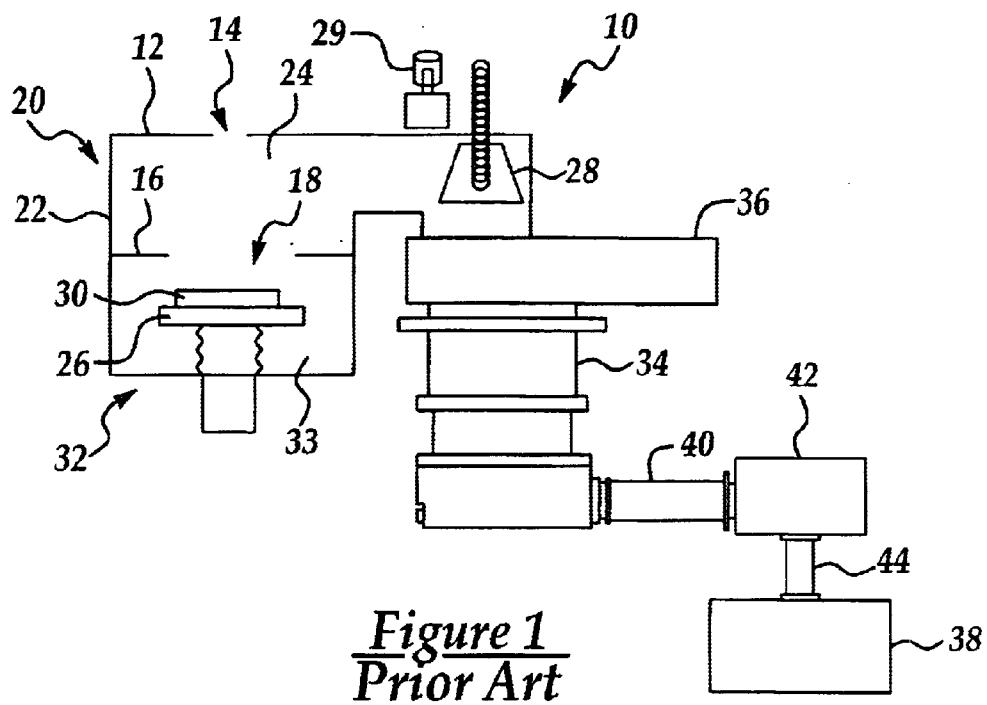
FIG. 1 is a schematic view of a conventional plasma etch chamber or system.

The plasma etch chamber 50 of the present invention further includes a venting apparatus 52 which may be either retrofitted to existing conventional plasma etch chambers 10 (FIG. 1) or constructed as a component part of the plasma etch chamber 50. The venting apparatus 52 includes a purge conduit 60 which is provided in gas communication with the output 35 of the turbo pump 34. A purge valve 58, which may be manual or electric, is provided in the purge conduit 60 for selectively allowing flow of clean, dry air, atmospheric air or nitrogen or other purge gas through the purge conduit 60 and into the turbo pump 34. In the embodiment illustrated in FIG. 2, a nitrogen gas or clean, dry air source 54 is connected to the input of the purge valve 58 by means of a conduit 56. In another embodiment (not illustrated), the gas source 54 is omitted and the conduit 56 or the input of the purge valve 58 communicates with atmospheric or ambient air. A vent conduit 62 extends from gas communication with the purge conduit 60, between the output end of the purge valve 58 and the output 35 of the turbo pump 34. A pair of ATM switches 76, 78 may be connected to the vent conduit 62 for purposes hereinafter described. An electric valve 64 is typically provided adjacent to a manual valve 66 in the vent conduit 62, and a flow restrictor 68 is typically further provided in the vent conduit 62, adjacent to the manual valve 66. The flow restrictor 68 may have any design known by those skilled in the art and is utilized to restrict flow of air or gas through the vent conduit 62, for purposes hereinafter described. An end cap 70, fitted with a gas vent 71, terminates the end of the vent conduit 62. A turbo pump controller 72 for operating the turbo pump 34 in conventional fashion may be connected to the electric valve 64 typically by wiring 74 to facilitate operating the electric valve 64 during operation of the turbo pump 34, as hereinafter further described.

After an etching process has been conducted on the wafer 30 on the electrostatic chuck 26 inside the chamber interior 33 of the main chamber 32, the wafer 30 is removed from the electrostatic chuck 26 and main chamber 32. The etchant gas is next evacuated from the main chamber 32 and the middle chamber 20 by operation of the turbo pump 34 through the gate valve 36. Simultaneously, the dry pump 38 is operated to draw the evacuated etchant gas from the output 35 of the dry pump 34, through the isolation valve 42 and into the dry pump 38. Simultaneous with the pumping process, an inert purge gas such as nitrogen is introduced into the middle chamber 20 and the main chamber 32 through the gas inlet 14 to further facilitate the removal of residual etchant gas. Like the etchant gas, the purge gas is evacuated from the main chamber 32 and middle chamber 20 and through the gate valve 36 by operation of the turbo pump 34, and from the output 35 of the turbo pump 34 and through the isolation valve 42 by operation of the dry pump 38.

Over a prolonged period of operation, repeated cycles of etchant gas flowing through the main chamber 32, the middle chamber 20 and the gate valve 36 after multiple etching operations frequently causes corrosion of the internal components of the main chamber 32, the middle chamber 20 and the gate valve 36. Accordingly, the internal components of the main chamber 32, the middle chamber 20 and the gate valve 36 must periodically be wet-cleaned and repaired for routine maintenance. This is accomplished by initially closing the gate valve 36 in order to vent any remaining residual etchant gas from the chamber interior 33 of the main chamber 32 and the chamber interior 24 of the middle chamber 20, typically by operation of a chamber auto-vent 28, which may be manually opened and closed by a lever 29. During this procedure, the still-operating turbo pump 34 generates an internal vacuum pressure which is isolated by the closed gate valve 36 and the isolation valve 38, whereas the air pressure in the chamber interiors 33 and 24, respectively, substantially equalizes with atmospheric air pressure as atmospheric or ambient air enters the chamber interiors 24, 33 through the chamber auto-vent 28.

After cleaning and maintenance of the main chamber 32, the middle chamber 20 and/or the gate valve 36 is completed, the partial vacuum pressure generated by the turbo pump 34 must be dispelled or at least reduced in order to prevent damage thereto which would otherwise be caused by re-opening of the gate valve 36 and rushing of atmospheric air from the chamber interior 24 of the middle chamber 20, through the turbo pump 34. Accordingly, the manual valve 66 of the venting apparatus 52 is opened, and the electric valve 64 is typically maintained in an open configuration by the turbo pump controller 72 during operation of the turbo pump 34. Next, the electrically- or manually-operated purge valve 58 is opened to facilitate entry of clean, dry air, nitrogen gas or other purge gas from the gas source 54 and into the output 35 of the turbo pump 34, due to the pressure differential between the higher-pressure gas source 54 and the lower-pressure partial vacuum in the turbo pump 34. Alternatively, in the embodiment of the plasma etch chamber 50 wherein the gas source 54 is omitted, atmospheric or ambient air is drawn through the open purge valve 58 and enters the output 35 of the turbo pump 34. In the foregoing manner, the purge gas or ambient or atmospheric purge air entering the turbo pump 34 from the purge conduit 60 tends to at least partially dispel the vacuum pressure in the turbo pump 34 and reduce or diminish the pressure differential between the atmospheric air pressure in the chamber interiors 24, 33 and the turbo pump 34. Next, the gate valve 36 is opened, and this action enables a relatively slow and smooth flow of atmospheric or ambient air from the chamber interiors 24, 33 and through the gate valve 36 and turbo pump 34. From the output 35 of the turbo pump 34, the atmospheric or ambient air from the chamber interiors 24, 33, in combination with the purge gas or air from the gas source 54 or atmosphere, flows from the purge conduit 60 and into the vent conduit 62, through the open electric valve 64, manual valve 66 and the flow restrictor 68, and out the vent 71 of the end cap 70. By preventing sudden escape of the air or purge gas and air mixture from the vent conduit 62, the flow restrictor 68 functions to prevent large pressure differentials from developing between the chamber interior 24 of the middle chamber 20 and the end cap 70 in the vent conduit 62, which large pressure differentials would otherwise cause high-velocity, and potentially pump-damaging, flow of the air through the turbo pump 34 upon opening the gate valve 36. The ATM switches 76, 78 indicate the air pressure in the vent conduit 62. Accordingly, opening of the gate valve 36 may be delayed until the air pressure in the turbo valve 34 is substantially the same as atmospheric pressure, due to the influx of purge gas, purge air or atmoshperic air into the purge conduit 60 through the purge valve 58.

It will be appreciated by those skilled in the art that the end cap 70 or vent conduit 62 may be provided with a two-way vent 71 which facilitates both exit of air from the vent conduit 62 and entry of atmospheric or ambient air into the vent conduit 62. In that case, the gas source 54, the conduit 56 and the purge valve 58 may optionally be omitted from the venting apparatus 52, since opening of the electric valve 64 and/or the manual valve 66 would facilitate entry of atmospheric or ambient air into the vent conduit 62 through the end cap 70, and to the turbo pump 34 through the purge conduit 60 to substantially equalize the pressure in the turbo pump 34 with the pressure in the chamber interior 24, prior to opening the gate valve 36 after maintenance.

While the preferred embodiments of the invention have been described above, it will be recognized and understood that various modifications can be made in the invention and the appended claims are intended to cover all such modifications which may fall within the spirit and scope of the invention.

What is claimed is:

1. An apparatus for reducing or eliminating a vacuum in a closed system, comprising:
    a vacuum source for forming the vacuum in the closed system;
    a vent conduit directly connected to an output of said vacuum source;
    at least one vent provided in said vent conduit;
    a first valve provided in said vent conduit between the system and said at least one vent;
    a purge conduit directly connected to said vent conduit; and
    a purge valve provided in said purge conduit.

2. The apparatus of claim 1 further comprising a gas source provided in gas communication with said purge valve.

3. The apparatus of claim 1 further comprising at least one switch provided in said vent conduit for measuring and indicating a gas pressure in said vent conduit.

4. The apparatus of claim 3 further comprising a gas source provided in gas communication with said purge valve.

5. The apparatus of claim 1 wherein said first valve comprises a manual valve.

6. The apparatus of claim 5 further comprising a gas source provided in gas communication with said purge valve.

7. The apparatus of claim 5 further comprising at least one switch provided in said vent conduit for measuring and indicating a gas pressure in said vent conduit.

8. The apparatus of claim 7 further comprising a gas source provided in gas communication with said purge valve.

9. The apparatus of claim 1 wherein said first valve comprises a manual valve and further comprising an electric valve provided in said vent conduit.

10. The apparatus of claim 9 further comprising a gas source provided in gas communication with said purge valve.

11. The apparatus of claim 9 further comprising at least one switch provided in said vent conduit for measuring and indicating a gas pressure in said vent conduit.

12. The apparatus of claim 11 further comprising a gas source provided in gas communication with said purge valve.

13. A plasma etch chamber with venting apparatus, comprising:
    a chamber;
    a turbo pump provided in gas communication with said chamber;
    a gate valve disposed between said chamber and said turbo pump;
    a vent conduit provided at an output of said turbo pump;
    at least one vent provided in said vent conduit;
    a first valve provided in said vent conduit between said turbo pump and said at least one vent;
    a purge conduit directly connected to said vent conduit; and
    a purge valve provided in said purge conduit.

14. The plasma etch chamber of claim 13 further comprising a gas source provided in gas communication with said purge valve.

15. The plasma etch chamber of claim 14 further comprising at least one switch provided in said vent conduit for measuring and indicating a gas pressure in said vent conduit.

16. The plasma etch chamber of claim 15 wherein said first valve comprises a manual valve and further comprising an electric valve provided in said vent conduit.

* * * * *